US008762916B1

(12) United States Patent
Kathail et al.

(10) Patent No.: US 8,762,916 B1
(45) Date of Patent: Jun. 24, 2014

(54) AUTOMATIC GENERATION OF A DATA TRANSFER NETWORK

(71) Applicant: Xilinx, Inc., San Jose, CA (US)

(72) Inventors: Vinod K. Kathail, Palo Alto, CA (US); L. James Hwang, Portola Valley, CA (US); Sundararajarao Mohan, Sunnyvale, CA (US); Hua Sun, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/776,318

(22) Filed: Feb. 25, 2013

(51) Int. Cl.
  *G06F 17/50* (2006.01)
(52) U.S. Cl.
  USPC ............. 716/116; 716/117; 326/37; 326/38
(58) Field of Classification Search
  USPC .................... 716/116–117; 326/37–38
  See application file for complete search history.

(56) References Cited

U.S. PATENT DOCUMENTS

| 7,941,791 | B2* | 5/2011 | Wang et al. | 717/140 |
|---|---|---|---|---|
| 8,190,807 | B2* | 5/2012 | Reid et al. | 711/3 |
| 8,533,503 | B2* | 9/2013 | Lippett | 713/320 |
| 8,533,716 | B2* | 9/2013 | Lippett | 718/100 |
| 2004/0020612 | A1* | 2/2004 | Bosio | 160/188 |
| 2004/0139428 | A1* | 7/2004 | Chuang et al. | 717/155 |
| 2005/0223382 | A1* | 10/2005 | Lippett | 718/103 |
| 2007/0220294 | A1* | 9/2007 | Lippett | 713/320 |
| 2008/0256330 | A1* | 10/2008 | Wang et al. | 712/24 |
| 2012/0096445 | A1* | 4/2012 | Berg et al. | 717/140 |
| 2013/0007730 | A1* | 1/2013 | Hotra et al. | 718/1 |
| 2013/0031554 | A1* | 1/2013 | Hou et al. | 718/100 |

OTHER PUBLICATIONS

Xilinx, Inc., *AutoSEL User Guide*, UG867 (v 2011.4), Oct. 2011, pp. 1-169, Xilinx. Inc., San Jose, California, USA.

* cited by examiner

*Primary Examiner* — Stacy Whitmore
(74) *Attorney, Agent, or Firm* — Kevin T. Cuenot (57) ABSTRACT

A method of automatically developing a data transfer network includes determining, using a processor, a plurality of data transfers of a function of a circuit design marked for hardware acceleration within a target integrated circuit. The circuit design is specified in a high level programming language, and at least one other function of the circuit design remains executable by a microprocessor of the target integrated circuit. Each of the plurality of data transfers is characterized. Each of the plurality of data transfers is correlated with resources of the target integrated circuit. A programmatic description of a data transfer network is generated for the circuit design. The data transfer network connects the hardware accelerator and the microprocessor according to the characterizing and the correlating.

20 Claims, 6 Drawing Sheets

```
int main(int argc, char *argv[ ])
{
        int a[32] [32], b[32] [32], c[32] [32], d[32] [32];
        //initialization code
        #pragma ACC
        matrix_multiply(a, b, c);
        #pragma ACC
        matrix_invert(c, d);
        function 1
        function 2
        return 0;
}
```

AUTOMATIC GENERATION OF A DATA TRANSFER NETWORK

RESERVATION OF RIGHTS IN COPYRIGHTED MATERIAL

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This specification relates to integrated circuits (ICs) and, more particularly, to automatically generating a data transfer network for a circuit design.

BACKGROUND

A System-On-A-Chip (SOC) is a type of integrated circuit (IC) that includes a microprocessor that operates in cooperation with other circuitry. Typically, the microprocessor executes program code and interacts with one or more function-specific circuits, e.g., that do not execute program code. In some cases, the SOC is formed of two or more dies within a single IC package. In other cases, the microprocessor and other circuitry are implemented on a single die. One example of an SOC includes a microprocessor and programmable circuitry. The programmable circuitry can be implemented using a field programmable gate array (FPGA) architecture.

An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Each programmable tile includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry typically are programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA. The functionality of an FPGA, or an FPGA portion of an SOC, is controlled by data bits provided to the IC for that purpose. The data bits, often referred to as a "bitstream," can be stored in volatile memory (e.g., static memory cells, as in FPGAs and some CPLDs), in non-volatile memory (e.g., FLASH memory, as in some CPLDs), or in any other type of memory cell.

In some cases, a circuit design for an SOC is specified in programmatic form using a high level programming language (HLL) such as C or C++. For example, the circuit design can be specified as a C program or a C++ program. One or more portions of the HLL program are intended to execute as program code on the microprocessor of the SOC. One or more other portions the circuit design are selected for implementation as hardware in the programmable circuitry of the SOC.

A portion of the HLL circuit design selected for implementation within the programmable circuitry is said to be selected for "hardware acceleration." The resulting hardware circuit design and/or physical circuitry corresponding to the portion of the HLL circuit design that is selected for hardware acceleration is referred to as a "hardware accelerator." The portions of the HLL circuit design selected for hardware acceleration, being implemented as physical circuitry, are no longer executed as program code within the microprocessor when the circuit design is implemented within an actual SOC. Typically, computationally intensive functions are selected for hardware acceleration.

Synthesis tools that operate upon HLL circuit designs can generate a single hardware module (e.g., a hardware description) for the portion of the HLL circuit design that is selected for hardware acceleration. For the hardware accelerator to operate properly, however, data must be shared between the hardware accelerator and the microprocessor. The process of incorporating the hardware accelerator into the larger circuit design within the SOC is a time consuming and manual process that is subject to error.

SUMMARY

A method includes determining, using a processor, a plurality of data transfers of a function of a circuit design marked for hardware acceleration within a target integrated circuit (IC). The circuit design is specified in a high level programming language and at least one other function of the circuit design remains executable by a microprocessor of the target IC. The method also includes characterizing each of the plurality of data transfers and correlating each of the plurality of data transfers with resources of the target IC. The method further includes generating a programmatic description of a data transfer network for the circuit design, wherein the data transfer network connects the hardware accelerator and the microprocessor according to the characterizing and the correlating.

A system includes a memory storing program code and a processor. The processor is coupled to the memory and, upon executing the program code, is configured to initiate a plurality of executable operations. The executable operations include determining a plurality of data transfers of a function of a circuit design marked for hardware acceleration within a target IC. The circuit design is specified in a high level programming language and at least one other function of the circuit design remains executable by a microprocessor of the target IC. The operations also include characterizing each of the plurality of data transfers and correlating each of the plurality of data transfers with resources of the target IC. The operations further include generating a programmatic description of a data transfer network for the circuit design, wherein the data transfer network connects the hardware accelerator and the microprocessor according to the characterizing and the correlating.

A non-transitory computer-readable medium stores instructions that, when executed by a processor, cause the processor to perform a method. The method includes determining, using the processor, a plurality of data transfers of a function of a circuit design marked for hardware acceleration within a target IC. The circuit design is specified in a high level programming language and at least one other function of the circuit design remains executable by a microprocessor of the target IC. The method also includes characterizing each of the plurality of data transfers and correlating each of the plurality of data transfers with resources of the target IC. The method further includes generating a programmatic description of a data transfer network for the circuit design, wherein the data transfer network connects the hardware accelerator and the microprocessor according to the characterizing and the correlating.

DETAILED DESCRIPTION

While the specification concludes with claims defining novel features, it is believed that the various features disclosed within this specification will be better understood from a consideration of the description in conjunction with the drawings. The process(es), machine(s), manufacture(s) and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

This specification relates to integrated circuits (ICs) and, more particularly, to automatically generating a data transfer network for a circuit design. In one aspect, the circuit design is intended for implementation within a System-On-A-Chip (SOC). An SOC is a type of IC that includes a microprocessor, which executes program code, and one or more circuitry portions. The circuitry portions, which are typically function specific, interact with the microprocessor during operation of the SOC.

In accordance with the inventive arrangements disclosed within this specification, one or more functions of a circuit design specified in a high level programming language (HLL) are marked, or otherwise designated, for hardware acceleration. The data transfers associated with the marked functions are characterized and correlated with resources of a target IC.

A target IC, which in this case is an SOC, refers to the particular IC, e.g., brand and model, in which the circuit design is to be implemented. A programmatic description of the data transfer network over which the data transfers are conducted within the target IC is generated automatically. The programmatic description of the data transfer network is generated according to the characterization and the correlation of the data transfers associated with the marked functions with the resources of the target IC.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
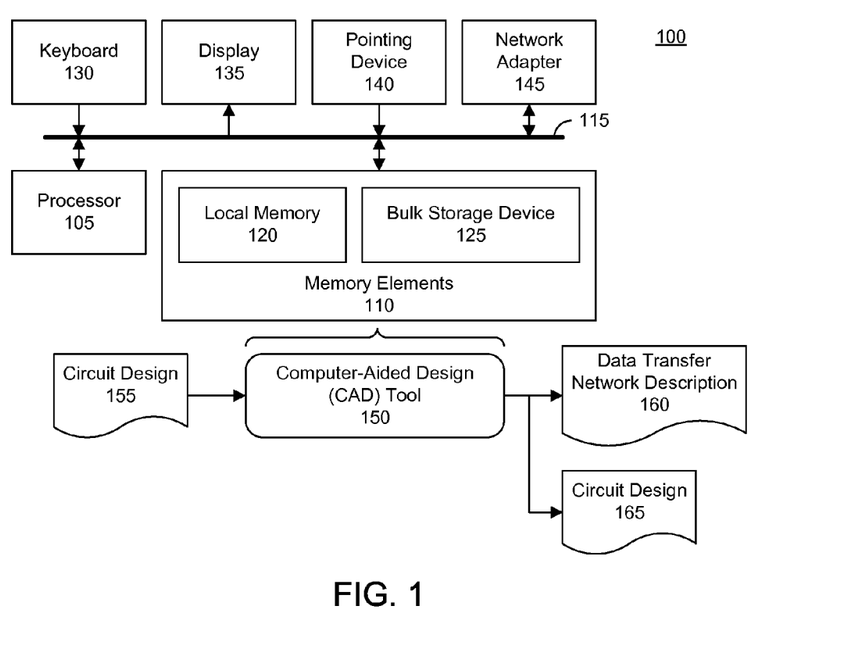
FIG. 1 is a block diagram illustrating an exemplary system for automated generation of a data transfer network for a circuit design.

FIG. 1 is a block diagram illustrating an exemplary system 100 for automated generation of a data transfer network for a circuit design. System 100 includes at least one processor 105, e.g., a central processing unit (CPU), coupled to memory elements 110 through a system bus 115 or other suitable circuitry. System 100 can store program code within memory elements 110. Processor 105 executes the program code accessed from memory elements 110 via system bus 115. In one aspect, system 100 is implemented as a computer that is suitable for storing and/or executing program code. It should be appreciated, however, that system 100 can be implemented in the form of any system including a processor and memory that is capable of performing the functions described within this specification.

Memory elements 110 include one or more physical memory devices such as, for example, local memory 120 and one or more bulk storage devices 125. Local memory 120 refers to random access memory or other non-persistent memory device(s) generally used during actual execution of the program code. Bulk storage device(s) 125 can be implemented as a hard disk drive (HDD), solid state drive (SSD), or other persistent data storage device. System 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device 140 optionally are coupled to system 100. The I/O devices can be coupled to system 105 either directly or through intervening I/O controllers. A network adapter 145 also can be coupled to system 100 to enable system 100 to become coupled to other systems, computer systems, remote printers, and/or remote storage devices through intervening private or public networks. Modems, cable modems, Ethernet cards, and wireless transceivers are examples of different types of network adapter 145 that can be used with system 100.

As pictured in FIG. 1, memory elements 110 store a computer-aided-design (CAD) tool 150. CAD tool 150, being implemented in the form of executable program code, is executed by system 100. As such, CAD tool 150 is considered an integrated part of system 100. CAD tool 150 operates upon a received circuit design 155. Circuit design 155 is specified in an HLL. Within this specification, a circuit design specified in an HLL is also referred to as an "HLL circuit design."

An HLL, as used within this specification, is a computer language or a computer programming language, whose instructions or statements each correspond to several machine instructions. Accordingly, an HLL provides strong abstraction from the details of the computer, particularly when compared with a lower level programming language such as assembly. HLLs routinely incorporate elements of natural language and, in addition, may automate entire areas of a computing system such as memory management. An HLL is executable or interpretable by a processor after application of one or more compilation, translation, or conversion steps. Examples of HLLs include, but are not limited to, object oriented programming languages such as Java™, Smalltalk, C++, etc., as well as conventional procedural programming languages, such as the "C" programming language or the like. Neither the term "HLL" nor the phrase "program code," as used within this specification, refers to a hardware description language (HDL) such as VHDL or Verilog, a netlist, or description of hardware.

An HDL refers to a computer-language that facilitates the documentation, design, and manufacturing of a digital system, such as an IC. An HDL, such as VHDL or Verilog, combines program verification techniques with expert system design methodologies. Using an HDL, for example, a user can design and specify an electronic circuit, describe the operation of the circuit, and create tests to verify operation of the circuit. In general, HDL includes standard, text-based expressions of the spatial and temporal structure and behavior of the electronic system being modeled. HDL syntax and semantics include explicit notations for expressing concurrency. In contrast to HLLs, HDLs include an explicit notion of time, which is a primary attribute of a digital system.

In one aspect, CAD tool 150 operates upon circuit design 155 to generate a hardware accelerator for each function of circuit design 155 that is marked for hardware acceleration. In another aspect, CAD tool 150, responsive to an analysis of circuit design 155, generates a programmatic description for a data transfer network, pictured as data transfer network description 160. The data transfer network described by data transfer network description 160 is the data transfer network over which data transfers associated with the functions to be hardware accelerated are conducted. In one aspect, CAD tool 150 outputs data transfer network description 160. In another aspect, CAD tool 150 incorporates data transfer network description 160 into another, modified version of circuit design 155, which is pictured as circuit design 165.

In one illustration, whereas circuit design 155 is specified in an HLL, data transfer network description 160 and/or circuit design 165 are specified in terms of hardware. For example, one or both of data transfer network description 160 and circuit design 165 can be specified as a netlist, in an HDL, as a bitstream, or as another non-HLL programmatic description of hardware.

CAD tool 150, circuit designs 155 and/or 165, data transfer network description 160, data flow graphs and/or intermediate representations of the foregoing that may be generated, and/or other parameters determined from circuit designs 155 and/or 165, are functional data structures. A functional data structure imparts functionality when employed as part of a system such as system 100. One or more of the functional data structures further impart functionality when employed within an IC, including programmable ICs, SOCs, etc., regardless of whether translated to one or more different formats, e.g., a configuration bitstream, prior to being employed.

Figure 2:
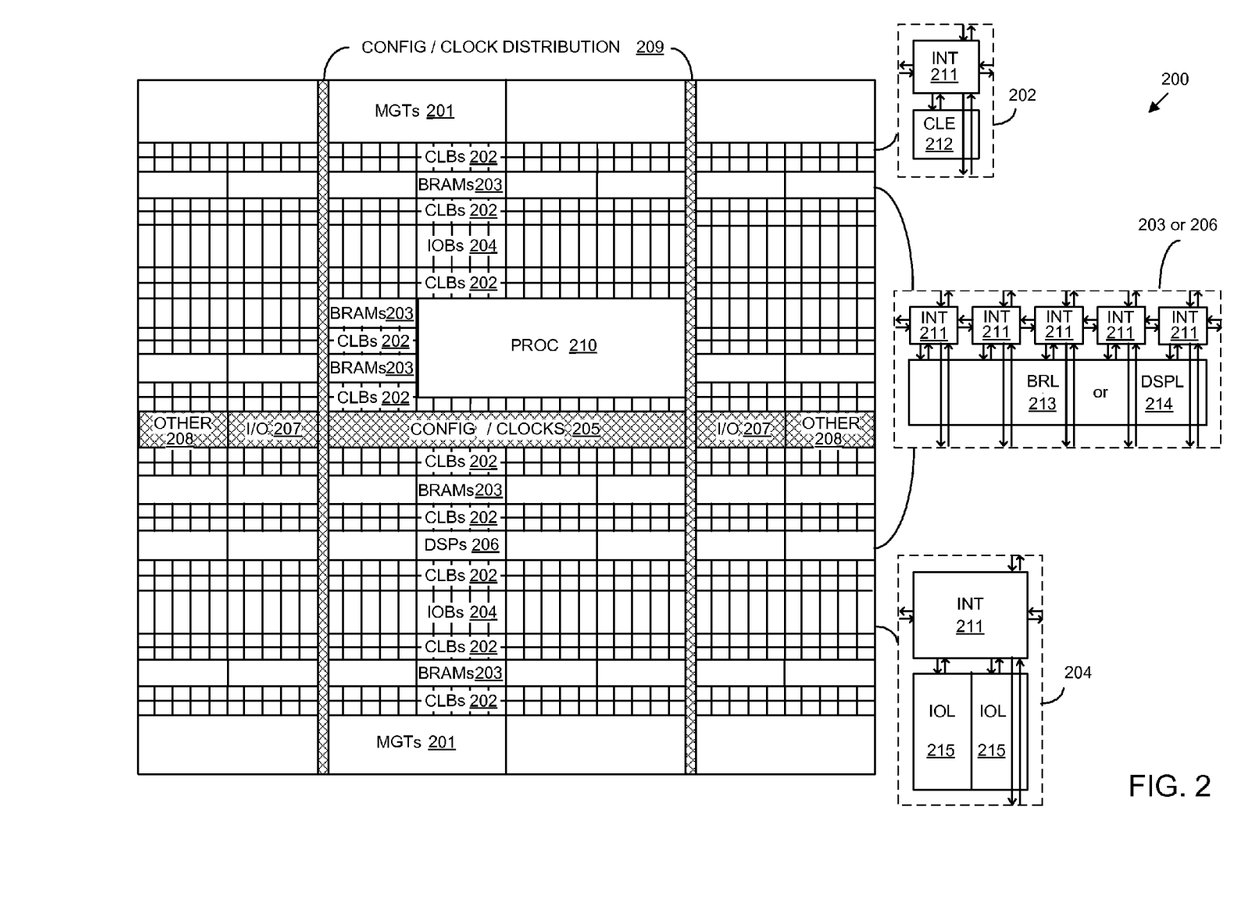
FIG. 2 is a block diagram illustrating an exemplary architecture for a System-On-A-Chip (SOC) type of IC.

FIG. 2 is a block diagram illustrating an exemplary architecture 200 for an SOC type of IC. Architecture 200 can be implemented to include FPGA type programmable circuitry, for example. As shown, architecture 200 includes several different types of programmable circuit blocks. In some cases, programmable circuit blocks are referred to as "logic blocks" or "tiles." For example, architecture 200 can include a large number of different programmable tiles including multi-gigabit transceivers (MGTs) 201, configurable logic blocks (CLBs) 202, random access memory blocks (BRAMs) 203, input/output blocks (IOBs) 204, configuration and clocking logic (CONFIG/CLOCKS) 205, digital signal processing blocks (DSPs) 206, specialized I/O blocks 207 (e.g., configuration ports and clock ports), and other programmable logic 208 such as digital clock managers, analog-to-digital converters, system monitoring logic, and so forth.

In some ICs, each programmable tile includes a programmable interconnect element (INT) 211 having standardized connections to and from a corresponding INT 211 in each adjacent tile. Therefore, the INTs 211, taken together, implement the programmable interconnect structure for the illustrated IC. Each INT 211 also includes the connections to and from the programmable logic element within the same tile, as shown by the examples included at the top of FIG. 2.

For example, a CLB 202 can include a configurable logic element (CLE) 212 that can be programmed to implement user logic plus a single INT 211. A BRAM 203 can include a BRAM logic element (BRL) 213 in addition to one or more INTs 211. Typically, the number of INTs 211 included in a tile depends on the height of the tile. In the pictured embodiment, a BRAM tile has the same height as five CLBs, but other numbers (e.g., four) can also be used. A DSP tile 206 can include a DSP logic element (DSPL) 214 in addition to an appropriate number of INTs 211. An IOB 204 can include, for example, two instances of an I/O logic element (IOL) 215 in addition to one instance of an INT 211. As will be clear to those of skill in the art, the actual I/O pads connected, for example, to IOL 215 typically are not confined to the area of IOL 215.

In the example pictured in FIG. 2, a columnar area near the center of the die, e.g., formed of regions 205, 207, and 208, can be used for configuration, clock, and other control logic. Horizontal areas 209 extending from this column are used to distribute the clocks and configuration signals across the breadth of the programmable IC.

Some ICs utilizing the architecture illustrated in FIG. 2 include additional logic blocks that disrupt the regular columnar structure making up a large part of the IC. The additional logic blocks can be programmable blocks and/or dedicated circuitry. For example, a processor block depicted as PROC 210 spans several columns of CLBs and BRAMs.

In one aspect, PROC 210 is implemented as a dedicated circuitry, e.g., as a hard-wired processor, that is fabricated as part of the die that implements the programmable circuitry of the IC. PROC 210 can represent any of a variety of different processor types and/or systems ranging in complexity from an individual processor, e.g., a single core capable of executing program code, to an entire processor system having one or more cores, modules, co-processors, interfaces, or the like.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions of circuitry shown in FIG. 2 such as CLBs 202 and BRAMs 203 are considered programmable circuitry of the IC.

The functionality of programmable circuitry is not established until configuration data is loaded into the IC. A set of configuration bits can be used to program programmable circuitry of an IC such as an FPGA. The configuration bit(s) typically are referred to as a "configuration bitstream" or a "bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is considered to have dedicated circuit blocks and interconnects, for example, that are functional for a particular purpose without first loading a configuration bitstream into the IC. PROC 210, for example, is a functional processor that is fabricated as part of the IC and is functional, e.g., configured, to execute program code without first loading configuration data. Configuration data, however, may be used to provide executable program code to PROC 210.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable to perform a particular function when manufactured as part of the IC.

FIG. 2 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 2 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 210 within the IC are for purposes of illustration only and are not intended as a limitation of the one or more embodiments disclosed within this specification.

Figure 3:
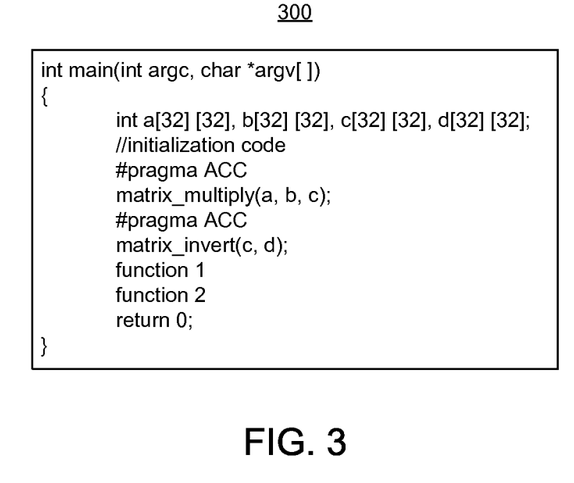
FIG. 3 is a block diagram illustrating an exemplary technique for marking portions of a high level programming language (HLL) circuit design for hardware acceleration.

FIG. 3 is a block diagram illustrating an exemplary technique for marking portions of a circuit design for hardware acceleration. FIG. 3 illustrates an HLL circuit design 300. Within HLL circuit design 300, two functions have been marked for hardware acceleration. The use of the statement "#pragma ACC" preceding (i.e., above) a statement indicates that the statement, which is a function call, immediately following is to be hardware accelerated. Thus, the function "matrix_multiply(a, b, c)" and the function "matrix_invert(c, d)" are to be hardware accelerated. It should be appreciated that any of a variety of different identifiers can be used as directives that are understandable by system 100 to mark a function for hardware acceleration. The particular mechanism shown in FIG. 3 is provided for purposes of illustration only. System 100, for example, detects the hardware acceleration directives while parsing and/or processing HLL circuit design 300.

Figure 4:
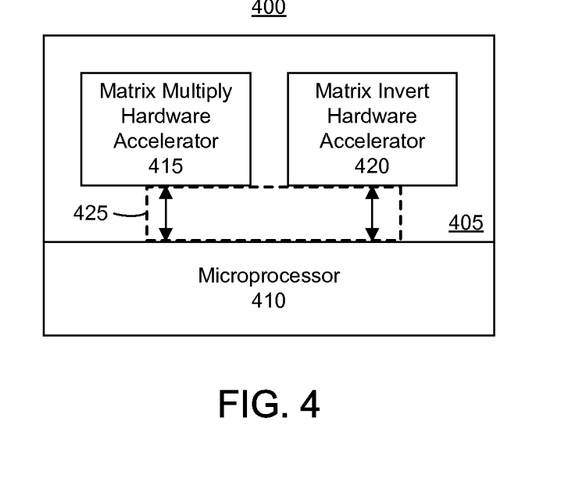
FIG. 4 is a block diagram illustrating an exemplary implementation of the HLL circuit design of FIG. 3 within an SOC.

FIG. 4 is a block diagram illustrating an exemplary implementation of HLL circuit design 300 within an SOC 400. SOC 400 includes programmable circuitry labeled 405 and a microprocessor 410. For the purposes of clarity and illustration, with reference to the remaining figures of this specification, the processor that is utilized within the SOC (e.g., PROC 210) is referred to as a "microprocessor." The processor that is utilized by the computing system, e.g., system 100, that operates upon the HLL circuit design to be implemented within the SOC is referred to as a "processor."

In one aspect, SOC 400 is implemented using an architecture the same as, or similar to, architecture 200 described with reference to FIG. 2. Accordingly, microprocessor 410 executes program code. Programmable circuitry 405 is configured by loading a configuration bitstream into configuration memory of SOC 400 to implement one or more user-specified, function-specific circuits. In the example pictured in FIG. 4, system 100 has implemented the function "matrix_multiply(a, b, c)" of HLL circuit design 300 of FIG. 3 as a circuit block called Matrix Multiply Hardware Accelerator 415. System 100 has implemented the function "matrix_invert(c, d)" of HLL circuit design 300 as a circuit block called "Matrix Invert Hardware Accelerator 420." In implementing HLL circuit design 300, system 100 effectively translates each function marked for hardware acceleration, as originally specified in HLL, into HDL, a netlist, and ultimately into a configuration bitstream that is loaded into SOC 400.

System 100 further evaluates HLL circuit design 300 of FIG. 3 to implement a data transfer network 425. Data transfer network 425 is configured to pass arguments a, b, and c between microprocessor 410 and Matrix Multiply Hardware Accelerator 415 and arguments c and d between microprocessor 410 and Matrix Invert Hardware Accelerator 420. Though not illustrated in this example, in other cases, the data transfer network that is implemented can include one or more direct connections between two or more hardware accelerators. System 100 generates the necessary programmatic description of data transfer network 425. As noted, the programmatic description of data transfer network 425 can be specified using HDL, as a netlist, as a configuration bitstream, etc.

Figure 5:
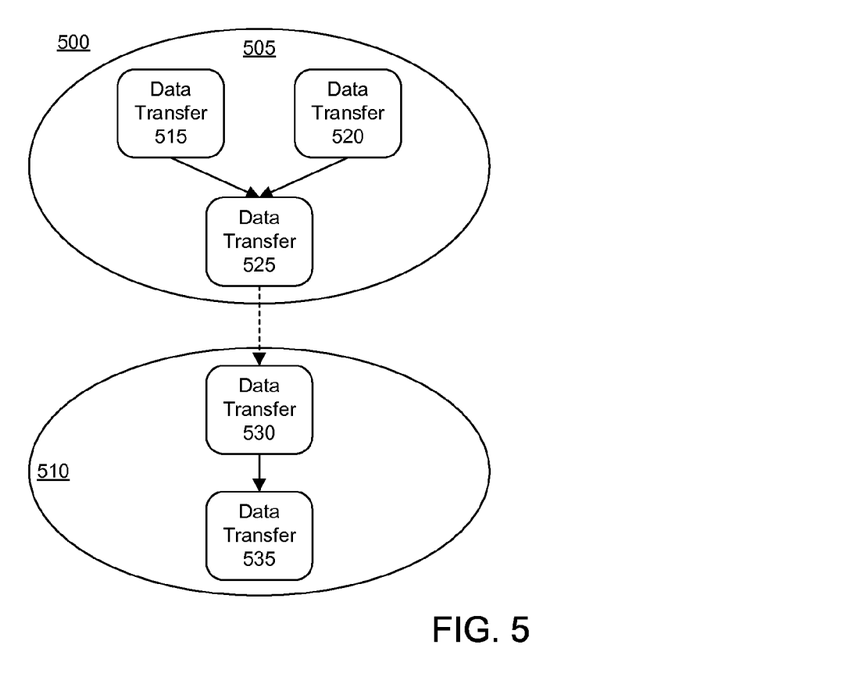
FIG. 5 is an example of a data transfer graph.

FIG. 5 is an example of a data transfer graph 500. In one aspect, system 100 of FIG. 1 is programmed to generate a data transfer graph as described with reference to FIG. 5 for an HLL circuit design or a portion thereof. Data transfer graph 500 represents, or models, the movement of data that is necessary to implement one or more functions of the HLL circuit design as hardware accelerators. The phrase "data transfer" refers to a data movement that occurs for an argument of a function that is hardware accelerated, e.g., synthesized into hardware.

Data transfer graph 500 includes an exemplary function 505 and an exemplary function 510, both of which are marked for hardware acceleration within an HLL circuit design. As such, each of functions 505 and 510 represents a hardware accelerator that is to be synthesized. Each of the data transfer nodes labeled 515, 520, 525, 530, and 535 represents a data transfer. Further, each of data transfer nodes 515-535 represents a portion of circuitry that is required to effectuate the data transfer. For purposes of description, reference to a "data transfer node" such as "data transfer node 515" refers to the node of data transfer graph 500 having the stated reference number, e.g., 515, within FIG. 5. Reference to a "data transfer" such as "data transfer 515" refers to the data transfer that is represented by the data transfer node of the same reference number.

Each data transfer can be characterized using a plurality of parameters referred to herein as "data transfer parameters." Examples of data transfer parameters include size (e.g., as measured in bytes), a data transfer type (e.g., the beginning and end points of the data transfer), a data transfer condition defining the circumstances and/or context under which the data transfer occurs, a data transfer frequency, and a number of occurrences of the data transfer.

Data transfer type indicates the direction of a data transfer. Data transfer type is assigned according to the source and destination of the data that is to be moved or transferred. Three exemplary data transfer types include (1) a data movement from microprocessor to hardware accelerator, (2) a data transfer from hardware accelerator to microprocessor, and (3) a data transfer from a first hardware accelerator to a second and different hardware accelerator.

Referring again to FIG. 5, the data transfer nodes further represent circuitry necessary to effectuate each respective data transfer. For example, data transfer node 515 and data transfer node 520 each represent circuitry necessary to receive a data transfer entering function 505, e.g., from the microprocessor. Data transfer node 525 represents circuitry necessary to effectuate a data transfer from function 505 to function 510. Data transfer node 530 represents the circuitry that receives the data transfer from function 505. Data transfer 535 represents the circuitry that implements a data transfer from function 510 to the microprocessor.

In analyzing a circuit design, system 100 determines the various dependencies that exist among the data transfers 515-535. Within FIG. 5, a "dependency" is represented by a directed line. A dependency defines an order between two, or more, data transfers. For example, if data transfer "A" is dependent on data transfer "B," then data transfer A cannot start until data transfer B is finished. Referring to FIG. 5, data transfer 530 is dependent upon data transfer 525 as indicated by the directed line connecting data transfer node 525 to data transfer node 530. As such, data transfer 530 cannot start until data transfer 525 completes. Similarly, data transfer 525 is dependent upon data transfer 515 and data transfer 520. Thus, data transfer 525 cannot start until both of data transfers 515 and 520 start.

Each dependency, as represented by a directed line within FIG. 5, can be annotated with one or more parameters characterizing the dependency. Within this specification, parameters characterizing a dependency are referred to "dependency parameters." Dependency parameters can be expressed as annotations on dependencies in a data flow graph or are otherwise associated with dependencies in a data flow graph. Examples of dependency parameters include, but are not limited to, latency and dependency type.

Latency is the amount of time separating two data transfers connected by a dependency. The latency of the dependency linking data transfer node 525 with data transfer node 530 indicates the amount of time separating data transfer 525 represented by data transfer node 525 from the data transfer 530 represented by data transfer node 530. For example, the latency can be measured as the amount of time separating the start time of data transfer 525 and the start time of data transfer 530.

Referring to dependency types, a first dependency type is input-to-output within a hardware accelerator as exemplified by the dependency linking data transfer node 530 with data transfer node 535. While latency is a separate parameter than dependency type, the latency of the first dependency type depends upon the way in which a given function is synthesized. For an input-to-output type of dependency that exists entirely within a hardware accelerator, the circuitry that implements the hardware accelerated function will, at least in part, determine latency.

A second type of dependency is output of a hardware accelerator to an input of a different hardware accelerator. The latency of the second dependency type depends largely upon whether the data transfer between the two hardware accelerators is software-related or is hardware-related.

When the second type of dependency is software-related, data moves from an output of a first hardware accelerator to microprocessor memory. The microprocessor executes one or more software instructions. The data is then moved from microprocessor memory to a second and dependent hardware accelerator. As such, the latency depends upon the time required to perform data transfers into and out of the microprocessor memory and the time required by the microprocessor to execute one or more software instructions.

When the second type of dependency is hardware-related, the data moves directly from one hardware accelerator to another hardware accelerator. In the hardware-related case, the latency depends upon the hardware interface between the two hardware accelerators, i.e., the generated data transfer network.

Figure 6:
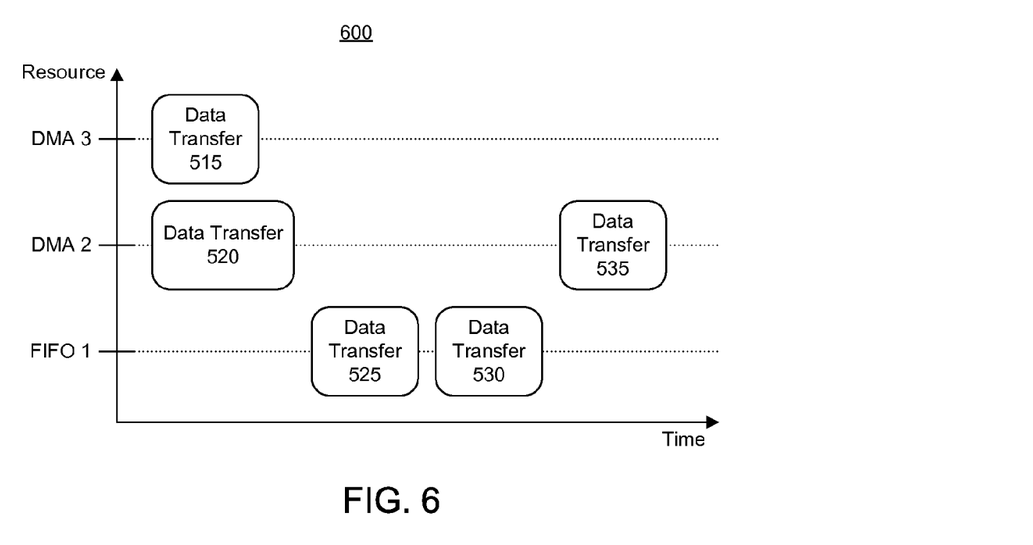
FIG. 6 is a table illustrating exemplary resource allocation and scheduling operations.

FIG. 6 is a table 600 illustrating exemplary resource allocation and scheduling operations. The vertical axis of table 600 illustrates different hardware resources, referred to herein as "resources," available with the target SOC. The resources shown are used to implement different data transfers required for hardware acceleration of one or more functions of an HLL circuit design.

System 100 performs resource allocation by determining the type of resources to be used for each data transfer and the number of each type of resource to be used. Allocation of resources can be performed, at least in part, in accordance with area and/or power constraints that may be in effect for implementation of the HLL circuit design. In this example, system 100 allocates the following resources for implementation of the data transfer network: FIFO 1, DMA 2, and DMA 3, which are illustrated on the vertical axis of table 600. The various data transfers, e.g., data transfers 515, 520, 525, 530, and 535, are scheduled using the allocated resources. In one aspect, system 100 schedules data transfers 515-535 by assigning each a start time. Once resources are allocated and the data transfers scheduled, each data transfer is bound to a specific instance of the particular type of resource allocated to the data transfer.

It should be appreciated that the processes of resource allocation, scheduling, and binding are inter-related and can be performed in an iterative manner. For example, two data transfers that overlap with one another cannot share a same resource. Rather, each overlapping data transfer requires a different resource. Sequential data transfers may share a same resource.

In another example, if only a single resource can be allocated due to an area constraint (i.e., a limit on the size of the circuitry as implemented in the target SOC), data transfers must be scheduled so as not to overlap with one another so that each data transfer can share the same resource. System 100 can perform an exploration of different scheduling, resource allocation, and binding alternatives to reach a data transfer network that is optimized according to any performance, area, and/or power requirements or objectives that may be in place.

Referring again to table 600, each of data transfers 515-535 has been allocated to a particular type of resource, i.e., a DMA or a FIFO. Further, each of data transfers 515-535 has been bound to a particular instance of each respective resource type. Data transfer 515 is bound to a particular DMA resource, i.e., DMA 3. Data transfers 520 and 535 are bound to a particular DMA resource, i.e., DMA 2. Data transfers 525 and 530 are bound to a particular FIFO resource, i.e., FIFO 1. Further, each data transfer has been scheduled as time is reflected on the horizontal axis. As shown, any two data transfers that are assigned to a same resource do not overlap in time.

Figure 7:
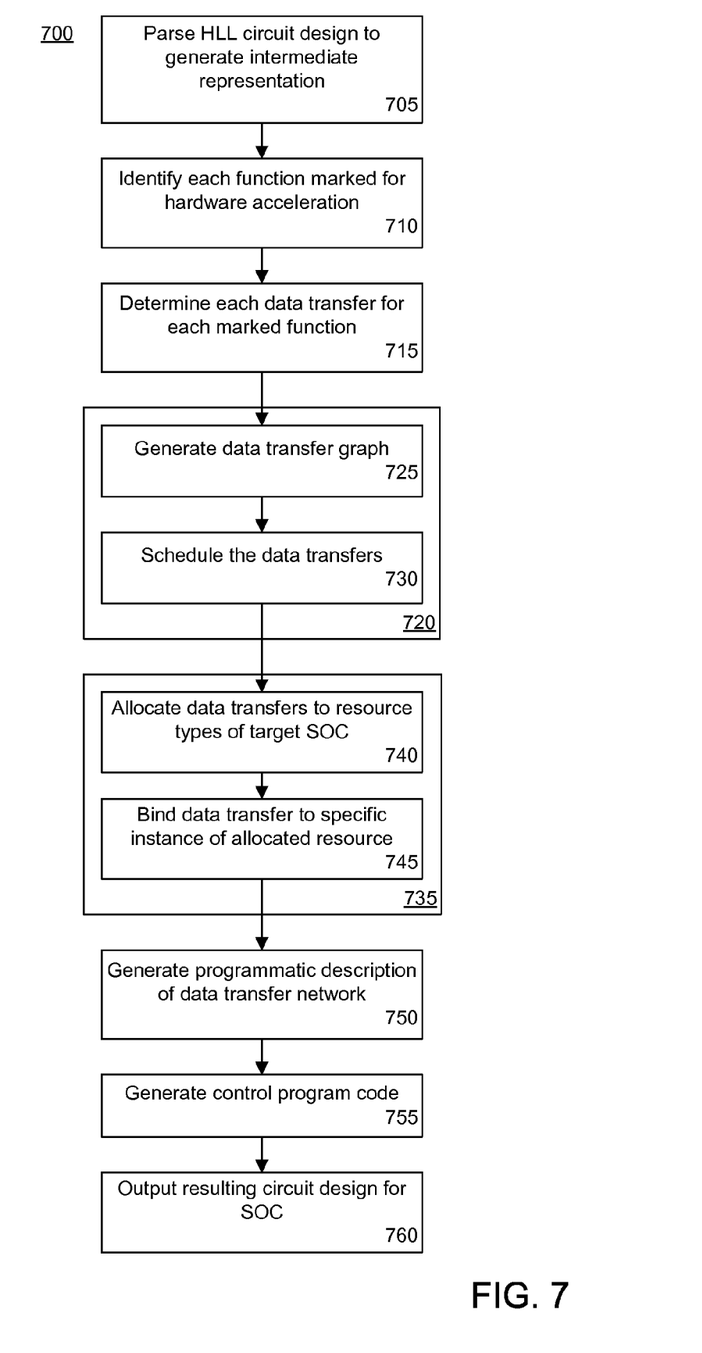
FIG. 7 is a flow chart illustrating an exemplary method of creating a data transfer network for an SOC.

FIG. 7 is a flow chart illustrating an exemplary method 700 of creating a data transfer network for an SOC. Method 700 can be performed by a system such as system 100 described with reference to FIG. 1 of this specification. Method 700 begins in a state where an HLL circuit design has been created and provided, e.g., loaded, into the system for processing. The HLL circuit design being processed includes one or more functions that have been marked for hardware acceleration.

In block 705, the system parses the HLL circuit design to generate an intermediate representation of the HLL circuit design. In one aspect, the format of the intermediate representation used is the "LLVM intermediate representation." LLVM is a collection of modular and reusable compiler and tool chain technologies. LLVM provides a core library which is a modern source-independent and target-independent optimizer, along with code generation support for various CPUs. The core libraries are built around a well specified code representation known as the LLVM intermediate representation.

In block 710, the system identifies each function that has been marked for hardware acceleration. In block 715, the system determines each data transfer that is associated with a marked function. As discussed, a data transfer is an argument of a function that is to be hardware accelerated. Accordingly, the system can determine each data transfer, i.e., argument, of a marked function.

In block 720, the system characterizes the data transfers. In block 725, the system generates a data transfer graph. The system generates the data transfer graph from the intermediate representation of the HLL circuit design for at least the functions marked for hardware acceleration. As discussed, the data transfer graph specifies the functions of the HLL circuit design to be hardware accelerated and the data transfers for the functions of the HLL circuit design to be hardware accelerated. As part of data transfer graph generation, the system determines dependencies among data transfers, characterizes data transfers by determining data transfer parameters, and characterizes dependencies by determining dependency parameters.

In block 730, the system schedules the data transfers. In scheduling each data transfer, the system determines latency between transfers. As discussed, the latency between two data transfers depends upon the type of dependency that exists between the two data transfers, e.g., first or second dependency type. Further, in the case of the second dependency type, latency is also dependent upon whether the latency is software-related or hardware-related. As noted, a software-related dependency means that data flows through the microprocessor. A hardware-related dependency means that data flows between two hardware accelerators without flowing through the microprocessor. Further, as part of the scheduling process, the system assigns a start time to each of the data transfers. The start time is determined, at least in part, according to the latencies.

For purposes of illustration, consider a data transfer that represents an argument of a function call for a function marked for hardware acceleration. As part of the scheduling, the system determines whether the function call is within a loop. The system can determine, for example, how many times data, e.g., the argument, is transferred in executing the loop. The number of times the argument is transferred is the number of times the function to be hardware accelerated is invoked or called. Such analysis can be performed by the system since the entire HLL circuit design is available for scrutiny.

Further, the system evaluates the body of the loop in which the function call is located. The system can evaluate other instructions in the loop body to determine a number of instructions to be executed, referred to as an instruction count, before the function marked for hardware acceleration is executed or invoked a next time. From this data, the system can calculate an estimated frequency of execution for the marked function and, as such, an amount of time between successive data transfers according, at least in part, to the number of instructions between successive invocations of the marked function.

In some cases, the system is unable to determine the likelihood that a given function marked for hardware acceleration will be executed. For example, the marked function may be located in a branch of the HLL circuit design. The system may not be able to determine the probability that the branch including the marked function will be taken, i.e., executed, at any given time. In such cases, users can provide input in the form of a file or other data entry indicating a likelihood or probability of the branch including the marked function being followed.

In block 735, the system begins the process of correlating data transfers with resources of the target SOC. In block 740, the system allocates each data transfer to a particular type of resource that is available within the target SOC for effectuating the data transfer. In one aspect, a data transfer can be allocated, or assigned, to a FIFO type of resource or a DMA type of resource.

In illustration, each available resource type of the target SOC can be profiled within the system. The system can store a profile for DMA type resources and a profile for FIFO type resources. The profile of a FIFO type of resource is characterized as having a memory mapped interface to the microprocessor that is slower than the interface of a DMA type of resource to the microprocessor. Further, the profile for a DMA type of resource indicates that a streaming interface is provided to the hardware accelerator, which is also considered a faster interface than is available for connecting a FIFO type of resource to the hardware accelerator.

Based upon the profile of each available resource and an analysis of the data transfer graph, the system can select an appropriate type of resource to be allocated to the data transfer. For example, based upon the above analysis of the data transfers, the system determines an amount of data that is to be moved and an amount of time in which the data is to be moved. The system can compare the data transfer parameters and/or the dependency parameters relating to the data transfer with the resource profiles to select an appropriate resource type for the data transfer. In this example, the appropriate resource type is the one that can implement the data transfer in the amount of time specified.

Another consideration is that the target SOC may provide more of one type of resource than another. For example, the target SOC may include more FIFO type resources than DMA type resources. Thus, if a given data transfer can be implemented using both a FIFO type of resource and a DMA type of resource, the system may select the FIFO type of resource, e.g., the more plentiful type of resource.

In another illustration, some resource types require a higher level of microprocessor involvement than other types of resources for operation. A DMA type of resource, for example, requires a higher level of microprocessor involvement and coordination to operate than does a FIFO type of resource. A FIFO resource, in effect, offloads the data transfer from the microprocessor to other specialized circuitry (i.e., hardware). Accordingly, the system can evaluate the level of microprocessor activity that is occurring when a data transfer is to be made so as not to overload the microprocessor. As an example, if the workload of the microprocessor would be pushed above a selected threshold by using a DMA type resource to effectuate a data transfer, the system would instead choose a FIFO type of resource to effectuate the data transfer in order to keep the workload of the microprocessor at an acceptable level, e.g., below the selected threshold. In this case, selecting the FIFO type of resource frees the microprocessor to perform other activities. This example presumes that both types of resources meet the speed requirements for the data transfer.

Another consideration when allocating resource types to data transfers relates to the role of the resource type within the target SOC. In illustration, the physical interface between the microprocessor and the programmable circuitry of an SOC is well defined. One example of such an interface can be one or more AXI interfaces. Depending upon the interface, some resource types may operate as slaves on the microprocessor side of the interface while other resource types operate as masters. A FIFO type of resource, for example, operates as a slave on the microprocessor side of an AXI interface, whereas a DMA operates as a master on the microprocessor side of the AXI interface within some target SOCs.

In block 745, the system binds, or assigns, each data transfer to a specific instance of the resource type assigned in block 740. For example, if a given data transfer is allocated to a DMA type of resource, in block 745, that data transfer is bound to a particular one of the DMA resources available on the target SOC. Similarly, if a given data transfer is allocated to a FIFO type of resource, in block 745, that data transfer is bound to a particular one of the FIFO resources available on the SOC.

In one example, the system can evaluate one or more different data transfers required for a given hardware accelerator. For example, a hardware accelerator that is operating upon two data streams concurrently, where each data stream or transfer corresponds to an argument, may require usage of two separate resources.

Consider an example in which the hardware accelerator is a video processor required to compare frames from two different data streams. If the amount of data is large and the hardware accelerator is able to perform the frame comparison quickly relative to the time required to transfer the data (frames), using one resource that is shared for both data transfers results in the hardware accelerator being idle for a significant amount of time while waiting for each frame to load into the hardware accelerator. In that case, the system can determine that the two data transfers should not share resources. Rather, each data transfer should be bound to its own instance of the allocated resource. For example, each data transfer should be bound to a different instance of a DMA resource to transfer data concurrently.

In another example, when the computational time required by the hardware accelerator takes longer, more time is available for data transfer. In that case, the system can determine that two or more data transfers for the hardware accelerator can share a same instance of a selected resource type. In each case, the system can compare the time required to transfer the data with the amount of time required for the hardware accelerator to process the data, e.g., operate upon received input data to produce an output.

In one aspect, the system can apply a ratio of the data to be operated upon to the processing time to determine whether a single resource should be shared or separate resources allocated to each data transfer. When the ratio of data to processing time exceeds the threshold, separate resources are used. In another aspect, the system can evaluate the idle processing time of the hardware accelerator. When the idle time exceeds a threshold, the system can use a separate instance of the resource for each data transfer.

In block 750, the system generates a programmatic description of the data transfer network. The programmatic description can be specified in an HDL, as a netlist, or the like. The data transfer network, as specified by the programmatic description, defines the circuitry implemented within the target SOC that conveys data between the microprocessor and any hardware accelerators derived from hardware accelerated functions of the HLL circuit design, and data that is moved among hardware accelerators, whether through the microprocessor or not.

The data transfer network description defines aspects of the data transfer network including, but not limited to, specific resources to be used for each data transfer in terms of type and instance, scheduling of data transfers, instantiation of IPs such as FIFOs and/or DMAs, hardware accelerator adapters, bus interconnects, sharing logic, etc. The data transfer network description further specifies the wiring or connectivity between the various entities noted.

In block 755, the system generates control program code. In one aspect, the system automatically generates program code that coordinates between the microprocessor and the driver level software that exists for the particular resources used to implement the data transfer network. The control program code is added to the portions of the HLL circuit design that execute within the microprocessor. The control program code configures the drivers to implement the data transfers.

In illustration, the control program code configures the drivers to ensure that data of a data transfer arrives at the destination at the correct time from a software point of view. The drivers may be kernel level drivers as are used with various operating systems or may all be compiled into an executable in environments where no operating system is used. In any case, the device drivers ensure that the resources of the data transfer network operate properly.

Unlike the control program code, a device driver is unaware of the actual content of the data being sent and/or received. Because the data transfer network is a switching network, the control program code adds or inserts any tags, symbols, or other identifiers into the data that may be required for steering the data through the data transfer network. The processing performed by the control program code operates at a level above the device drivers. It should be appreciated, however, that the system instruments the portion of the HLL circuit design that executes in the microprocessor with both control program code and the necessary drivers for sending and/or receiving data over the generated data transfer network.

In block 760, the system outputs the resulting circuit design for the SOC. In one aspect, the circuit design can be output as instrumented HLL program code, instrumented object code (e.g., instrumented compiled code such as machine code, etc.), or the like that is to be executed in the microprocessor and a hardware circuit design specifying the hardware accelerators and the data transfer network. Each portion can be output and/or stored separately. In another aspect, the entirety of the circuit design can be output in the form of a bitstream. The resulting circuit design for the target SOC can be output and/or stored in a memory in any of a variety of different formats. As such, the specification is not intended to be limited by the particular representation of the circuit design including the data transfer network.

FIG. 7 describes a process in which an HLL circuit design is provided as input or a starting point. In another aspect, rather than providing an HLL circuit design as input, a designer can provide the system with various parameters manually from which the data transfer network can be generated. For example, a user can provide the various parameters that would otherwise be obtained from the HLL circuit design (or intermediate representation thereof) in generating a data transfer graph. The various operations described herein can be applied to the manually created parameters or to a manually created data transfer graph as the case may be to automatically generate the data transfer network.

Figure 8:
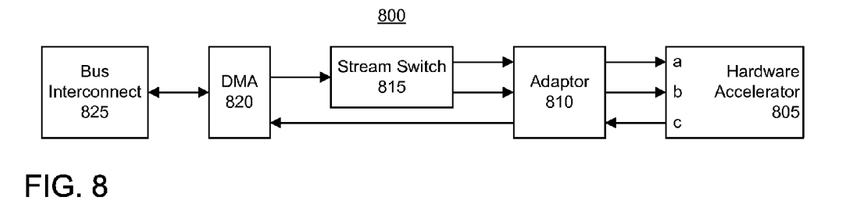
FIG. 8 is a block diagram illustrating an exemplary data transfer network.

FIG. 8 is a block diagram illustrating an exemplary data transfer network 800. Data transfer network 800 is automatically generated by system 100 from an HLL circuit design. As pictured, data transfer network 800 is coupled to hardware accelerator 805 and includes an adapter 810, a stream switch 815, a DMA 820, and a bus interconnect module 825. DMA 820 has an input channel coupled to adapter 810 and an output channel coupled to stream switch 815. Inputs "a" and "b" of hardware accelerator 805 each receive a data transfer. The data transfers to inputs "a" and "b" are scheduled sequentially. For that reason, a same DMA output channel is shared among the two data transfers, which requires stream switch 815 to provide the correct data to inputs "a" and "b."

Figure 9:
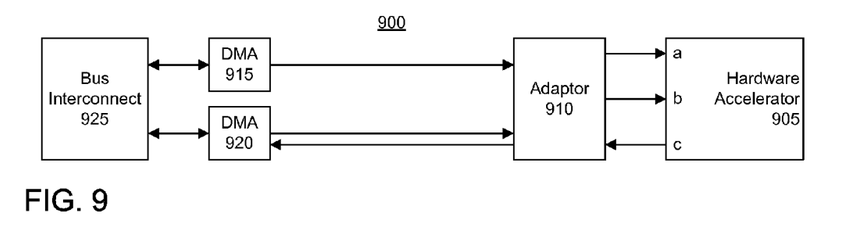
FIG. 9 is a block diagram illustrating another exemplary data transfer network.

FIG. 9 is a block diagram illustrating another exemplary data transfer network 900. Data transfer network 900 is automatically generated by system 100 from an HLL circuit design. As pictured, data transfer network 900 is coupled to a hardware accelerator 905 and includes an adapter 910, a DMA 915, a DMA 920, and a bus interconnect module 925. Data transfer network 900 is similar to that of FIG. 8, with the exception that the data transfer to input "a" is scheduled concurrently, e.g., overlaps in time, with the data transfer to input "b." As such, two DMAs are used so that each data transfer has a dedicated output channel.

Figure 10:
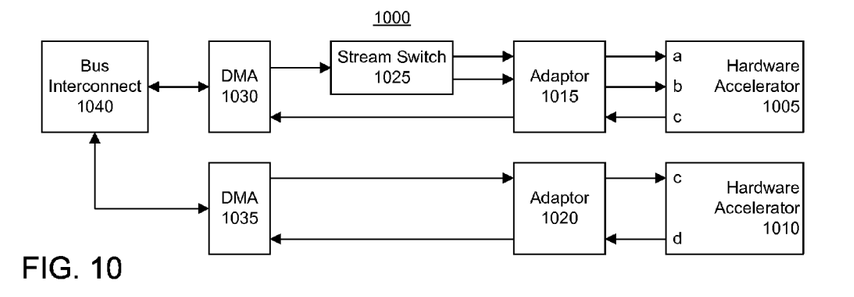
FIG. 10 is a block diagram illustrating another exemplary data transfer network.

FIG. 10 is a block diagram illustrating another exemplary data transfer network 1000. Data transfer network 1000 is automatically generated by system 100 from an HLL circuit design. As pictured, data transfer network 1000 is coupled to two hardware accelerators labeled hardware accelerator 1005 and hardware accelerator 1010. Data transfer network 1000 includes adaptor 1015, adapter 1020, stream switch 1025, DMA 1030, DMA 1035, and bus interconnect 1040.

In this example, inputs "a" and "b" of hardware accelerator 1005 are scheduled sequentially. The data transfer to input "a" is sequentially scheduled with the data transfer to input "b." As such, a same DMA output channel is shared among the two data transfers, which requires stream switch 1025 to provide the correct data from DMA 1030 to inputs "a" and "b" of hardware accelerator 1005. Further, system 100 has determined that a dependency exists between the output of hardware accelerator 1005 and the input of hardware accelerator 1010. System 100 determines that the dependency occurs through software code, e.g., is software-related. As such, the output of hardware accelerator 1005 must be transferred back to the microprocessor using DMA 1030. Processing is performed using the output from hardware accelerator 1005 by the microprocessor. The data is then transferred from the microprocessor to input "c" of hardware accelerator 1010 using DMA 1035 by way of adaptor 1020.

Figure 11:
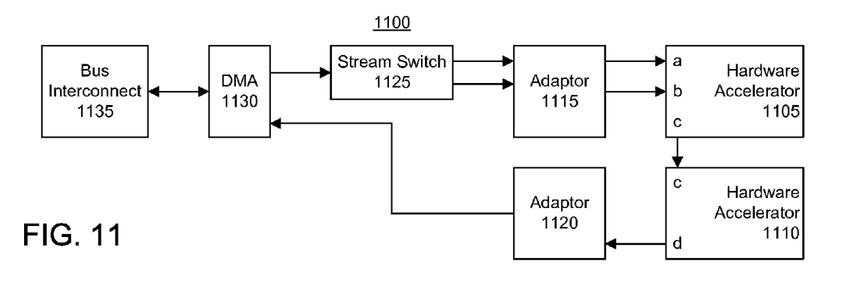
FIG. 11 is a block diagram illustrating another exemplary data transfer network.

FIG. 11 is a block diagram illustrating another exemplary data transfer network 1100. Data transfer network 1100 is automatically generated by system 100 from an HLL circuit design. As pictured, data transfer network 1100 is coupled to two hardware accelerators labeled hardware accelerator 1105 and hardware accelerator 1110. Data transfer network 1100 includes adaptor 1115, adaptor 1120, stream switch 1125, DMA 1130, and bus interconnect 1135. In this example, inputs "a" and "b" of hardware accelerator 1105 are scheduled sequentially. As such, a same DMA output channel, i.e., DMA 1130, is shared among the two data transfers, which requires stream switch 1125 to provide the correct data to inputs "a" and "b" of hardware accelerator 1105.

Data transfer network 1100 is similar to that of FIG. 10, with the exception that system 100 determines that a dependency exists between hardware accelerator 1105 and hardware accelerator 1110. Further, no software code intervenes in the dependency as is the case in FIG. 10. As such, a direct connection is established from the output "c" of hardware accelerator 1105 to the input "c" of hardware accelerator 1110. As such, only a single DMA 1130 is required.

This specification relates to the automated generation of a data transfer network for a circuit design to be implemented within an SOC. The data transfer network is generated based upon an analysis of the entire HLL circuit design. As part of the analysis, data transfers are identified and characterized as are dependencies among data transfers. Using the analysis, resources of the target SOC are allocated, scheduled, and bound. Further, control program code is generated that is included in the circuit design for execution by the microprocessor of the target SOC.

For purposes of explanation, specific nomenclature is set forth to provide a thorough understanding of the various inventive concepts disclosed herein. The terminology used herein is for the purpose of describing particular embodiments only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects disclosed within this specification can be realized in hardware or a combination of hardware and software. One or more aspects can be realized in a centralized fashion in one system or in a distributed fashion where different elements are spread across several interconnected systems. Any kind of data processing system or other apparatus adapted for carrying out at least a portion of the methods described herein is suited.

One or more aspects further can be embedded in a device such as a computer program product that includes all the features enabling the implementation of the methods described herein. The computer program product includes a data storage medium, e.g., a non-transitory computer-usable or computer-readable storage medium, storing program code that, when loaded and executed in a system including a processor, causes the system to initiate and/or perform at least a portion of the functions or operations described within this specification. Examples of data storage media can include, but are not limited to, optical media, magnetic media, magneto-optical media, computer memory such as random access memory, a bulk storage device, e.g., hard disk, or the like.

Accordingly, the flowchart and block diagrams in the Figures illustrate the architecture, functionality, and operation of possible implementations of systems, methods and computer program products according to various embodiments of the one or more embodiments disclosed herein. In this regard, each block in the flowchart or block diagrams may represent a module, segment, or portion of program code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a data processing system perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this specification, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. A method, comprising:
   determining, using a processor, a plurality of data transfers of a function of a circuit design marked for hardware acceleration within a target integrated circuit;
   wherein the circuit design is specified in a high level programming language and at least one other function of the circuit design remains executable by a microprocessor of the target integrated circuit;
   wherein each data transfer is an argument of the marked function specified in the high level programming language;
   characterizing each of the plurality of data transfers according to a ratio of size of the data transfer to computational time for a circuit block implementation of the marked function to process the data transfer;
   correlating each of the plurality of data transfers with resources of the target integrated circuit, at least in part, by determining a number of resources for use in implementing the data transfers according to the ratio for each data transfer; and
   generating a programmatic description of a data transfer network for the circuit design, wherein the data transfer network connects the hardware accelerator and the microprocessor according to the characterizing and the correlating.

2. The method of claim 1, wherein the characterizing comprises:
   identifying a dependency specifying a latency between a first data transfer and a second data transfer of the plurality of data transfers in which the second data transfer is dependent upon the first data transfer; and
   scheduling each of the plurality of data transfers.

3. The method of claim 1, further comprising:
   instrumenting a portion of the high level programming language that executes in the microprocessor with control program code and drivers for the resources;
   wherein the control program code is executable to configure the drivers for the resources to implement the data transfers and add identifiers into data being transferred to steer data through the data transfer network.

4. The method of claim 2, wherein the latency is dependent upon program code executing within the microprocessor.

5. The method of claim 2, wherein the latency is not dependent upon program code executing within the processor.

6. The method of claim 1, further comprising:
   using a single resource for at least two of the plurality of data transfers to meet an area constraint; and
   scheduling each of the at least two data transfers so as to not overlap in time.

7. The method of claim 1, wherein the correlating comprises:

allocating a resource type of the target integrated circuit to each of the plurality of data transfers, wherein the allocating comprises selecting, for each data transfer, either a direct memory access resource or a first-in-first-out memory resource as the resource type; and for each of the plurality of data transfers, binding a specific instance of the resource type to the data transfer.

8. The method of claim 1, further comprising:
determining a workload for the microprocessor occurring when at least one of the plurality of data transfers is to be made; and
selecting a type of the resource used to implement the at least one data transfer according to whether the workload of the microprocessor exceeds a threshold.

9. The method of claim 1, further comprising:
identifying a further data transfer between the first hardware accelerator and a second hardware accelerator;
characterizing the further data transfer;
correlating the further data transfer with a further resource of the target integrated circuit; and
generating further programmatic description for the data transfer network for the circuit design, wherein the further programmatic description connects the first hardware accelerator with the second hardware accelerator according to the characterizing of the further data transfer and the correlating of the further data transfer.

10. A system, comprising:
a memory comprising program code; and
a processor coupled to the memory, wherein the processor, upon executing the program code, is configured to initiate a plurality of executable operations comprising:
determining a plurality of data transfers of a function of a circuit design marked for hardware acceleration within a target integrated circuit;
wherein the circuit design is specified in a high level programming language and at least one other function of the circuit design remains executable by a microprocessor of the target integrated circuit;
wherein each data transfer is an argument of the marked function specified in the high level programming language;
characterizing each of the plurality of data transfers according to a ratio of size of the data transfer to computational time for a circuit block implementation of the marked function to process the data transfer;
correlating each of the plurality of data transfers with resources of the target integrated circuit, at least in part, by determining a number of resources for use in implementing the data transfers according to the ratio for each data transfer; and
generating a programmatic description of a data transfer network for the circuit design, wherein the data transfer network connects the hardware accelerator and the microprocessor according to the characterizing and the correlating.

11. The system of claim 10, wherein the characterizing comprises:
identifying a dependency specifying a latency between a first data transfer and a second data transfer of the of data transfers in which the second data transfer is dependent upon the first data transfer; and
scheduling each of the plurality of data transfers.

12. The system of claim 10, further comprising:
instrumenting a portion of the high level programming language that executes in the microprocessor with control program code and drivers for the resources;
wherein the control program code is executable to configure the drivers for the resources to implement the data transfers and add identifiers into data being transferred to steer data through the data transfer network.

13. The system of claim 11, wherein the latency is dependent upon program code executing within the microprocessor.

14. The system of claim 11, wherein the latency is not dependent upon program code executing within the processor.

15. The system of claim 10, further comprising:
using a single resource for at least two of the plurality of data transfers to meet an area constraint; and
scheduling each of the at least two data transfers so as to not overlap in time.

16. The system of claim 10, wherein the correlating comprises:
allocating a resource type of the target integrated circuit to each of the plurality of data transfers, wherein the allocating comprises selecting, for each data transfer, either a direct memory access resource or a first-in-first-out memory resource as the resource type;
for each of the plurality of data transfers, binding a specific instance of the resource type to the data transfer.

17. The system of claim 10, further comprising:
determining a workload for the microprocessor occurring when at least one of the plurality of data transfers is to be made; and
selecting a type of the resource used to implement the at least one data transfer according to whether the workload of the microprocessor exceeds a threshold.

18. The system of claim 10, wherein the processor is further configured to initiate executable operations comprising:
identifying a further data transfer between the first hardware accelerator and a second hardware accelerator;
characterizing the further data transfer;
correlating the further data transfer with a further resource of the target integrated circuit; and
generating further programmatic description for the data transfer network for the circuit design, wherein the further programmatic description connects the first hardware accelerator with the second hardware accelerator according to the characterizing of the further data transfer and the correlating of the further data transfer.

19. A non-transitory computer-readable medium having instructions that, when executed by a processor, cause the processor to implement a method comprising:
determining, using the processor, a plurality of data transfers of a function of a circuit design marked for hardware acceleration within a target integrated circuit;
wherein the circuit design is specified in a high level programming language and at least one other function of the circuit design remains executable by a microprocessor of the target integrated circuit;
wherein each data transfer is an argument of the marked function specified in the high level programming language;
characterizing each of the plurality of data transfers according to a ratio of size of the data transfer to computational time for a circuit block implementation of the marked function to process the data transfer;
correlating each of the plurality of data transfers with resources of the target integrated circuit, at least in part, by determining a number of resources for use in implementing the data transfers according to the ratio for each data transfer; and generating a programmatic description of a data transfer network for the circuit design, wherein the data transfer network connects the hardware accelerator and the microprocessor according to the characterizing and the correlating.

20. The non-transitory computer-readable medium of claim 19, wherein the characterizing comprises:
identifying a dependency specifying a latency between a first data transfer and a second data transfer of the plurality of data transfers in which the second data transfer is dependent upon the first data transfer; and
scheduling each of the plurality of data transfers.

* * * * *